United States Patent
Pelekhaty et al.

(10) Patent No.: US 8,908,745 B2
(45) Date of Patent: Dec. 9, 2014

(54) ANALOG CONTINUOUS TIME MATCHED PULSE SHAPING TRANSMITTER AND RECEIVER FILTERS

(75) Inventors: Vladimir Pelekhaty, Baltimore, MD (US); Michael Y. Frankel, Baltimore, MD (US); Michael J. Wingrove, Kanata (CA)

(73) Assignee: Ciena Corporation, Hanover, MD (US)

( * ) Notice: Subject to any disclaimer, the term of this patent is extended or adjusted under 35 U.S.C. 154(b) by 501 days.

(21) Appl. No.: 13/008,072

(22) Filed: Jan. 18, 2011

(65) Prior Publication Data

US 2012/0183092 A1    Jul. 19, 2012

(51) Int. Cl.
*H04B 1/00* (2006.01)
*H04L 27/36* (2006.01)
*H04L 25/03* (2006.01)
*H03H 17/02* (2006.01)

(52) U.S. Cl.
CPC ............ *H04L 27/36* (2013.01); *H04L 25/0384* (2013.01); *H03H 17/0289* (2013.01)
USPC ........... 375/152; 375/143; 375/146; 375/147; 375/343; 375/346; 375/350; 455/63.1; 455/67.13; 455/114.2

(58) Field of Classification Search
CPC ............. H04L 25/03; H04L 25/3006; H04L 25/03828; H04L 25/0384
USPC ................. 375/130, 219, 260, 285, 346, 350
See application file for complete search history.

(56) References Cited

U.S. PATENT DOCUMENTS

| | | | |
|---|---|---|---|
| 5,309,482 A * | 5/1994 | Wright et al. | 375/350 |
| 5,414,311 A | 5/1995 | Carley | |
| 5,736,909 A | 4/1998 | Hauser et al. | |
| 5,909,460 A * | 6/1999 | Dent | 375/130 |
| 6,553,398 B2 | 4/2003 | Capofreddi | |
| 2002/0150184 A1* | 10/2002 | Hafeez et al. | 375/346 |
| 2007/0230593 A1* | 10/2007 | Eliaz et al. | 375/260 |
| 2010/0003936 A1* | 1/2010 | Behzad et al. | 455/132 |
| 2012/0154071 A1* | 6/2012 | Bradley et al. | 333/133 |

OTHER PUBLICATIONS

Yeo, S.H.; Farhang-Boroujeny, B., "An improved design of transmit digital and receive analog filters to combat timing jitter," Global Telecommunications Conference, 1997. GLOBECOM '97., IEEE , pp. 1204-1208 , Nov. 3-8, 1997.*
KR Electronics, Inc; "KR 2388 Root Raised Cosine Filter"; Web: www.krfilters.com—(c) 2001, KR Electronics, Inc.

(Continued)

*Primary Examiner* — Daniel Washburn
*Assistant Examiner* — Eboni Hughes
(74) *Attorney, Agent, or Firm* — Clements Bernard PLLC; Christopher L. Bernard; Lawrence A. Baratta, Jr.

(57) ABSTRACT

The present invention provides a transmission system, including: a transmitter including a transmitter filter; a receiver including a receiver filter; and a communicative coupling between the transmitter and the receiver; wherein the transmitter filter and the receiver filter are matched for noise reduction, and wherein the combined responses of the transmitter filter and the receiver filter satisfy the Nyquist criteria. Optionally, the transmitter filter includes a pulse shaping quasi digital finite impulse response filter. Optionally, the receiver filter includes an inductor-capacitor ladder based filter.

14 Claims, 9 Drawing Sheets

(56) References Cited

OTHER PUBLICATIONS

Hui Wu, Jose A. Tierno, Petar Pepeljugoski, Jeremy Schaub, Sudhir Gowda, Jeffrey A. Kash, and Ali Hajimiri (IEEE Members); "Integrated Transversal Equalizers in High-Speed Fiber-Optic Systems"; The Journal of solid-State Circuits, vol. 38, No. 12, Dec. 2003.
Nuhertz—The Best in Filter Design; An Analog CMOS High-Speed Continuous-Time FIR; Nuhertz Technologies, Inc., 1 E Camelback Rd., Phoenix, AZ 85012-1675; www.nuhertz.com.
Efram Burlingame and Richard Spencer (Solid-State Circuits Research Laboratory Depart. of Electrical and Computer Engineering, University of California, Davis, CA); "An Analog CMOS High-Speed Continuous-Time FIR Filter"; Research supported by Level One Communications Inc., National Semiconductor, Silicon Systems, Inc. and the UC Micro program.
Xiaofeng Lin and Jin Liu; A CMOS Analog Continuous-Time FIR Filter for 1Gbps Cable Equalizer; Department of Electrical Engineering, the University of Texas at Dallas, Richardson, TX; (c)2003 IEEE.

* cited by examiner

ANALOG CONTINUOUS TIME MATCHED PULSE SHAPING TRANSMITTER AND RECEIVER FILTERS

FIELD OF THE INVENTION

The present invention relates to analog continuous time matched pulse shaping transmitter and receiver filters. These transmitter and receiver filters find application in bandwidth efficient signal transmission, which requires the precise filtering of both transmitted and received signals. Examples of such applications include, but are not limited to, densely packed multi carrier radio communication channels, wire communication channels, and fiber optic communication channels, the later of which include, but are not limited to, broadband polarization multiplexed coherent quadrature amplitude modulated (QAM) orthogonal frequency division multiplexed (OFDM) channels.

BACKGROUND OF THE INVENTION

In the above applications, for example, transmitter filters are tasked with shaping the transmitted pulse, while receiver filters are tasked with rejecting interfering neighboring channels and reducing noise. The frequency and pulse responses of combined transmitter filters and receiver filters are the product of their frequency responses and the convolution of their pulse responses. In order to eliminate inter symbol interference (ISI) and inter channel interference (ICI), the combined filter characteristics should satisfy the following Nyquist criteria: the signal in the center of the eye should be maximum for the received symbol, while it should be zero for all other symbols associated with the same and neighboring channels. The ISI elimination property is enforced by the central symmetry of the slopes of the power frequency response around the points of half-width-at-half-maximum (HWHM), located at ±half of the baud from the center frequency of the channel. This frequency response corresponds to the pulse response featuring a central main lode and time decaying side lobes, which cross zero exactly at the center of each bit. The ICI elimination property is enforced by the steep slopes of the frequency response, amounting to zero outside of the channel bandwidth.

The most commonly known example of the Nyquist shaped frequency response is a raised cosine (RC) function having a shaping parameter, $\alpha$, which is called a roll off or excess bandwidth factor. When $\alpha=0$, the frequency response is most confined and has the shape of a uniform rectangle between ±half of the baud from the center frequency of the channel. Alternatively, when $\alpha=1$, the frequency response has the shape of a RC restricted between ±baud from the center frequency of the channel, with intermediate cases having the uniform central portion of the frequency and RC slopes. It is important to note that, for a QAM format, the ICI is completely eliminated only for $\alpha=0$, while, for larger roll offs, the offset QAM (OQAM) format is more appropriate.

Matched filtering properties of transmitter and receiver Nyquist filters are ensured by equally splitting the combined Nyquist frequency response of the channel between the transmitter filter and the receiver filter. As a result, the exemplary combined RC response is split into two equal square root RC (SRRC) frequency responses. This results in optimal noise reduction within the channel.

Conventionally, transmitter and receiver filters are realized by digital signal processing (DSP) means as linear phase digital finite impulse response (FIR) SRRC filters. DSP chips used for signal pre and post filtering and equalization, although immensely popular, tend to become larger and more power hungry with an increase in the bandwidth of the processed signals. Analog filters are able to perform the same tasks faster, have smaller size, consume less power, and tend to use larger and cheaper semiconductor process geometries.

There are known filter designs, and even commercially available filter products, based on lumped inductor-capacitor (LC) components that feature both RC and SRRC responses. In these designs and products, the challenging tasks of the synthesis and realization of an SRRC response with a linear phase are accomplished. However, they have limited bandwidth, are bulky and complex, and have very high tolerance requirements for their constituent reactive elements, which also involve mutual inductances in addition to the regular inductors and capacitors.

An analog FIR filter may be implemented most straightforwardly as a continuous time transmission line based filter, wherein each transmission line (typically implemented as a stripline) serves as an analog delay element. The primary disadvantage of this type of filter is the large physical size of each transmission line, resulting in severe area inefficiency. As a result, it is difficult to implement designs of this type in integrated circuit technologies, especially for low baud signals that would require correspondingly long delay lines.

Transmission lines in the above type of filter may be realized in the form of balanced LC ladder based analog delay elements, instead of striplines, making them much more compact and integratable, although still quite sizable due to the many inductor coils necessary for the realization of the required delays. The primary disadvantage of this type of filter is the signal distortion caused by the non-ideal phase characteristics of the LC ladder based analog delay elements.

It is possible to eliminate the designated analog delay elements of the FIR filter by pipelining the analog voltage waveforms along the chain of varying taps from one repeating amplifier to another. The necessary delays are realized as inherent delays of the repeating amplifiers, which are designed to have the Bessel type transfer characteristics with fixed and flat delay over the bandwidth of the signal delay. The primary disadvantage of this type of filter is increased complexity and power consumption due to the numerous active analog delay elements, as well as signal distortion and noise accumulation along the chain of amplifiers.

Finally, there is a class of discrete time analog FIR filters, which, according to their designating name, pipeline the discrete time samples of the analog voltage waveforms along the chain of varying taps from one sample-and-hold (S/H) or track-and-hold (T/H) amplifier to another. In this case, the necessary delays are produced by clocking the S/H or T/H amplifiers at time intervals equal to the delay time increments between the taps of the FIR filter. Such designs are disadvantaged by the need for fast and complex sampling circuitry, and suffer from noise, offset, and nonlinearity errors accumulating as the signal propagates along the chain of S/H or T/H stages.

BRIEF SUMMARY OF THE INVENTION

In various exemplary embodiments, the present invention provides a design method related to a pulse shaping filter. This cooperative design incorporates the functionality of a quasi-digital FIR transmitter filter and a simple LC ladder based receiver filter. The constituent filters are matched for optimum noise reduction and their combined responses satisfy the Nyquist criteria. The FIR transmitter filter utilizes a combination of digital delays and analog coefficient control and tap summation. The FIR transmitter filter may be calibrated to compensate for residual manufacturing imperfections of both the transmitter and receiver components. Transmitter data processing and FIR filtering accomplishes the simultaneous pulse shaping and digital-to-analog conversion required for multi level, multi bit modulation formats, such as multi level QAM (MQAM). The FIR transmitter filter is dynamically adaptable to compensate for channel distortion impairments, such as radio frequency (RF) chain gain and phase ripple, signal dispersion present in the communication channel, etc. Only a single receiver filter is required per I and Q data streams. The demodulation and decision slicing of multi level, multi bit modulation formats occurs subsequent to data filtering.

In one exemplary embodiment, the present invention provides a circuit, including: a transmitter filter; a receiver filter; and a communicative coupling between the transmitter filter and the receiver filter; wherein the transmitter filter and the receiver filter are matched for noise reduction, and wherein the combined responses of the transmitter filter and the receiver filter satisfy the Nyquist criteria. Optionally, the transmitter filter includes a pulse shaping quasi digital finite impulse response filter. Optionally, the receiver filter includes an inductor-capacitor ladder based filter.

In another exemplary embodiment, the present invention provides a transmission system, including: a transmitter including a transmitter filter; a receiver including a receiver filter; and a communicative coupling between the transmitter and the receiver; wherein the transmitter filter and the receiver filter are matched for noise reduction, and wherein the combined responses of the transmitter filter and the receiver filter satisfy the Nyquist criteria. Again, optionally, the transmitter filter includes a pulse shaping quasi digital finite impulse response filter. Optionally, the receiver filter includes an inductor-capacitor ladder based filter.

In a further exemplary embodiment, the present invention provides a transmission method, including: at a transmitter, filtering a signal utilizing a transmitter filter; transmitting the signal from the transmitter to the receiver utilizing a communicative coupling; and, at a receiver, filtering the signal utilizing a receiver filter; wherein the transmitter filter and the receiver filter are matched for noise reduction, and wherein the combined responses of the transmitter filter and the receiver filter satisfy the Nyquist criteria. Again, optionally, the transmitter filter includes a pulse shaping quasi digital finite impulse response filter. Optionally, the receiver filter includes an inductor-capacitor ladder based filter.

BRIEF DESCRIPTION OF THE DRAWINGS

The present invention is illustrated and described herein with reference to the various drawings, in which like reference numbers are used to denote like system components/methods steps, as appropriate, and in which.

DETAILED DESCRIPTION OF THE INVENTION

Again, in various exemplary embodiments, the present invention provides a design method related to a pulse shaping filter. This cooperative design incorporates the functionality of a quasi-digital FIR transmitter filter and a simple LC ladder based receiver filter. The constituent filters are matched for optimum noise reduction and their combined responses satisfy the Nyquist criteria. The FIR transmitter filter utilizes a combination of digital delays and analog coefficient control and tap summation. The FIR transmitter filter may be calibrated to compensate for residual manufacturing imperfections of both the transmitter and receiver components. Transmitter data processing and FIR filtering accomplishes the simultaneous pulse shaping and digital-to-analog conversion required for multi level, multi bit modulation formats, such as multi level QAM (MQAM). The FIR transmitter filter is dynamically adaptable to compensate for channel distortion impairments, such as radio frequency (RF) chain gain and phase ripple, signal dispersion present in the communication channel, etc. Only a single receiver filter is required per I and Q data streams. The demodulation and decision slicing of multi level, multi bit modulation formats occurs subsequent to data filtering.

Figure 1:
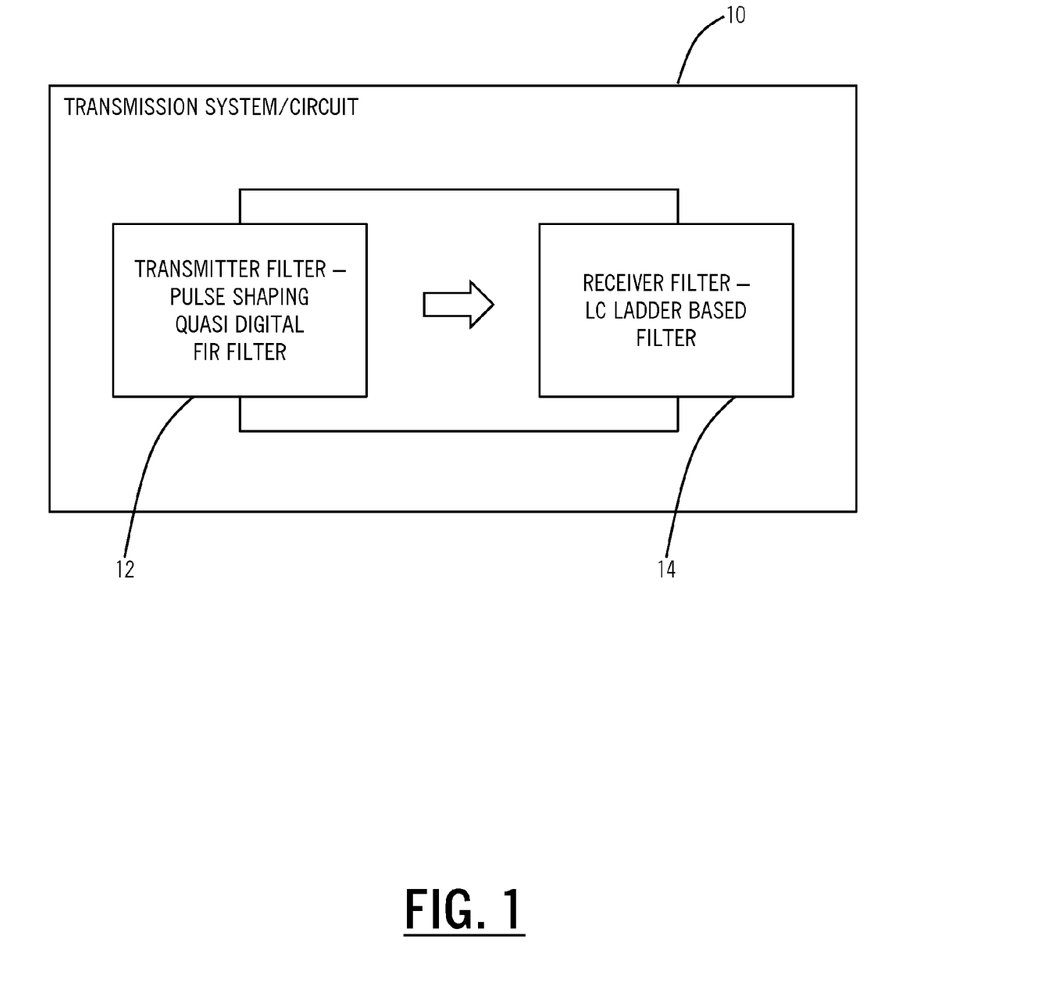
FIG. 1 is a schematic diagram illustrating one exemplary embodiment of a transmission system or circuit of the present invention, the transmission system or circuit incorporating a transmitter filter and a receiver filter that are communicatively coupled and matched for noise reduction, with combined responses that satisfy the Nyquist criteria.

FIG. 1 is a schematic diagram illustrating one exemplary embodiment of the transmission system or circuit 10 of the present invention, the transmission system or circuit 10 incorporating a transmitter filter 12 and a receiver filter 14 that are communicatively coupled and matched for noise reduction, with combined responses that satisfy the Nyquist criteria. In this exemplary embodiment, the transmitter filter 12 is a pulse shaping quasi digital FIR filter and the receiver filter 14 is a LC ladder based filter.

Focusing first on the design principles of the pulse shaping quasi digital FIR transmitter filter, the fundamental design principle is a reliance on the repeatability and reproducibility of the transient waveforms at the output of the essentially digital cells, produced on the same wafer by a reliable integration technique. The pulse and step responses of the digital cells are emulated by the waveforms from a single ONE surrounded by ZEROS, and by transitions between long streams of ONES and ZEROS. In the case of bandwidth efficient operation, the pulse and step responses of the digital cells may be approximated by a time domain raised cosine (RC) function (it is important to note that this RC pulse shape is in the time domain, and should not be confused with the requirement for RC shaping of the frequency response). The pulse and step responses of the real digital cells may differ from this approximation, but may be readily measured and modeled for utilization in the synthesis procedures of the analog FIR filter, similar to those described below. Further, the dynamic aspect of the FIR filter allows for self optimization of the final manufactured circuitry.

The pulse shaping function of the FIR transmitter filter in the first approximation requires the transformation of the input RC pulse into a pulse response of the SRRC frequency domain filter. In the frequency domain, this corresponds to the multiplication of the known spectrum of the input RC pulse by the unknown, but computed, frequency transfer function of the filter, with the goal of obtaining the desired SRRC shaped frequency response for the output pulse. The frequency response of the required pulse shaping filter may be computed as the ratio of spectra of the output and input pulses. The tap weights of the analog FIR filter are in turn obtainable as time samples of the pulse response corresponding to the computed frequency response of the pulse shaping transmitter filter. The sampling time instances are conventionally chosen at half baud intervals for standard 2× oversampling, and the number of samples is equal to the number of taps of the FIR filter.

Figure 2:
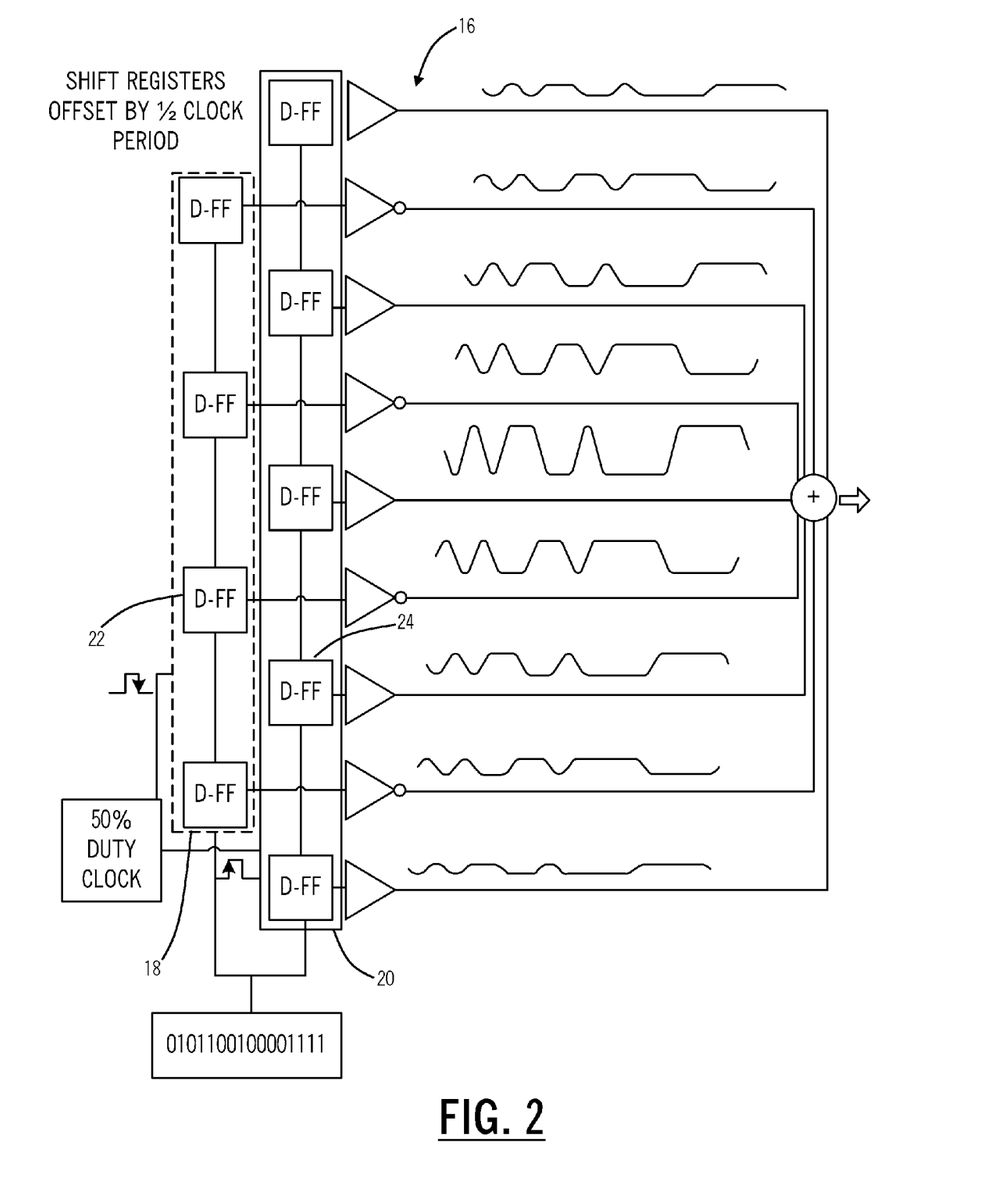
FIG. 2 is a schematic diagram illustrating one exemplary embodiment of a binary pulse shaping FIR transmitter filter of the present invention.

FIG. 2 is a schematic diagram illustrating one exemplary embodiment of a 9-tap binary pulse shaping FIR transmitter filter 16 of the present invention. Extensions to higher order formats are discussed in greater detail herein below. Digital data is fed into two shift registers 18 and 20; the even shift register 18 including four D-type flip-flops (D-FFs) 22 and the odd shift register including five D-FFs 24. Both shift registers 18 and 20 are shifted by the baud clock, except that one shift register is delayed by a half baud period with respect to the other shift register. This delayed shifting may be executed by, for example, triggering one shift register by the leading edge of the 50%-duty ratio square baud clock pulses, while triggering the other shift register by the trailing edge of the same 50%-duty ratio square baud clock pulses. Alternatively, the same delayed shifting may be executed by triggering the shift registers 18 and 20 by the leading/trailing edges of even or, correspondingly, odd numbered clock pulses at double baud. The output of each D-FF 22 and 24 is buffered by an identical follower or inverter (depending on the sign of the corresponding tap weight), either followed by an adjustable attenuator, or having a programmable gain. It is also possible to realize polarity control by alternatively switching either one of two complementary outputs of the D-FFs 22 and 24 to the input of a buffer cell. All of this provides means of control of the sign and magnitude weight coefficients of the correspondingly even and odd numbered taps of the analog FIR filter 16 of the present invention. All of the outputs of the buffers are added together to produce the weighted and time staggered sums of the identical replicas of the continuous time bipolar (AC-coupled) waveforms, as is illustrated in FIG. 2.

In the case of a binary phase shift keying (BPSK) format, the resulting summed waveform amplitude modulates the carrier, either RF or optical, depending on the physical nature of the communication channel. In the case of the offset quadrature phase shift keying (OQPSK) format, two separate data streams (I data and Q data) are time delayed by a half baud period with respect to each other and are pulse shaped in the above described fashion by their separate analog FIR pulse shaping filters and subsequently supplied to I and Q amplitude RF or optical modulators, depending, again, on the physical nature of the communication channel. This description is focused primarily on the center channel of the densely packed OFDM channel spectrum. All other neighboring signals, which are pulse shaped in a similar manner, are added to the central channel's signal before the modulator and after they are frequency shifted, either up or down, by conventional methods.

The transmission pulses shaped by the FIR filter 16, in the first approximation, correspond to the SRRC spectral window and, hence, are perfectly compatible with only an ideal SRRC receiver filter. The present invention exploits the equalizing potential of the FIR filter 16 to compensate for the non-ideal filtering properties of very simple LC ladder lowpass receiver filters by further adjusting its taps. Computer optimization of FIR filter taps and reactances comprised in an LC ladder filter is performed with added white Gaussian noise. The optimization criterion is the maximization of the Q factors of the detected signal. This automatically results in the combination of matched transmitter and receiver filters for noise reduction and satisfying the Nyquist criteria for the elimination of ISI and ICI.

The starting conditions for the computer optimization are first approximation FIR filters 16 and LC ladder lowpass Butterworth filter prototypes with 3-dB bandwidth equal to half of the baud frequency. Three designs are produced for $2^{nd}$, $3^{rd}$, and $4^{th}$-order receiver filters paired with 13, 9, and 7-tap FIR transmitter filters 16, respectively. The resulting parameters of the optimized filters for 1.875 GBd are presented in FIGS. 3-5.

Figure 3:
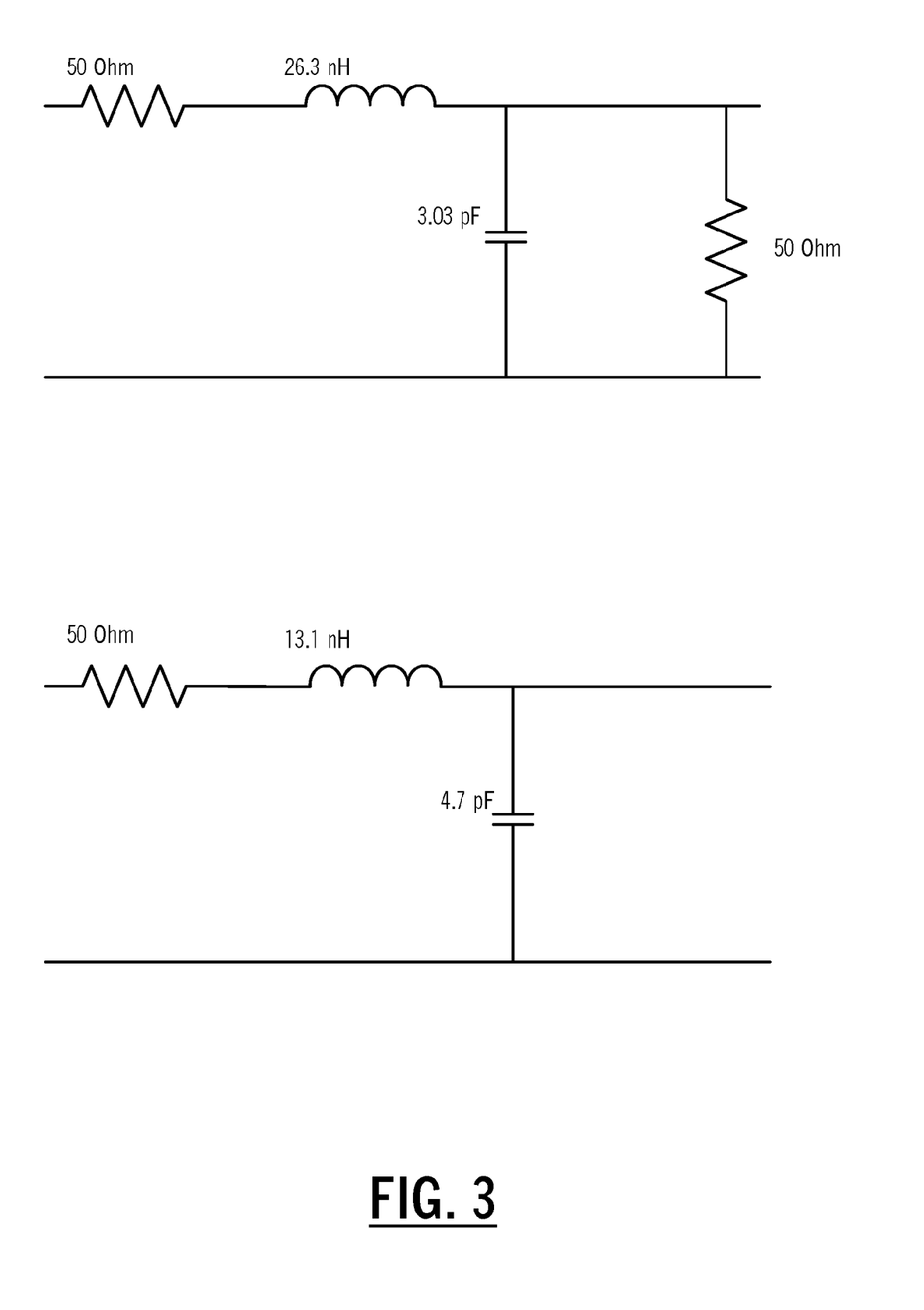
FIG. 3 is a series of schematic diagrams illustrating terminated (top) and unterminated (bottom) $2^{nd}$-order LC ladder receiver filters corresponding to a 13-tap analog FIR transmitter filter.
Figure 4:
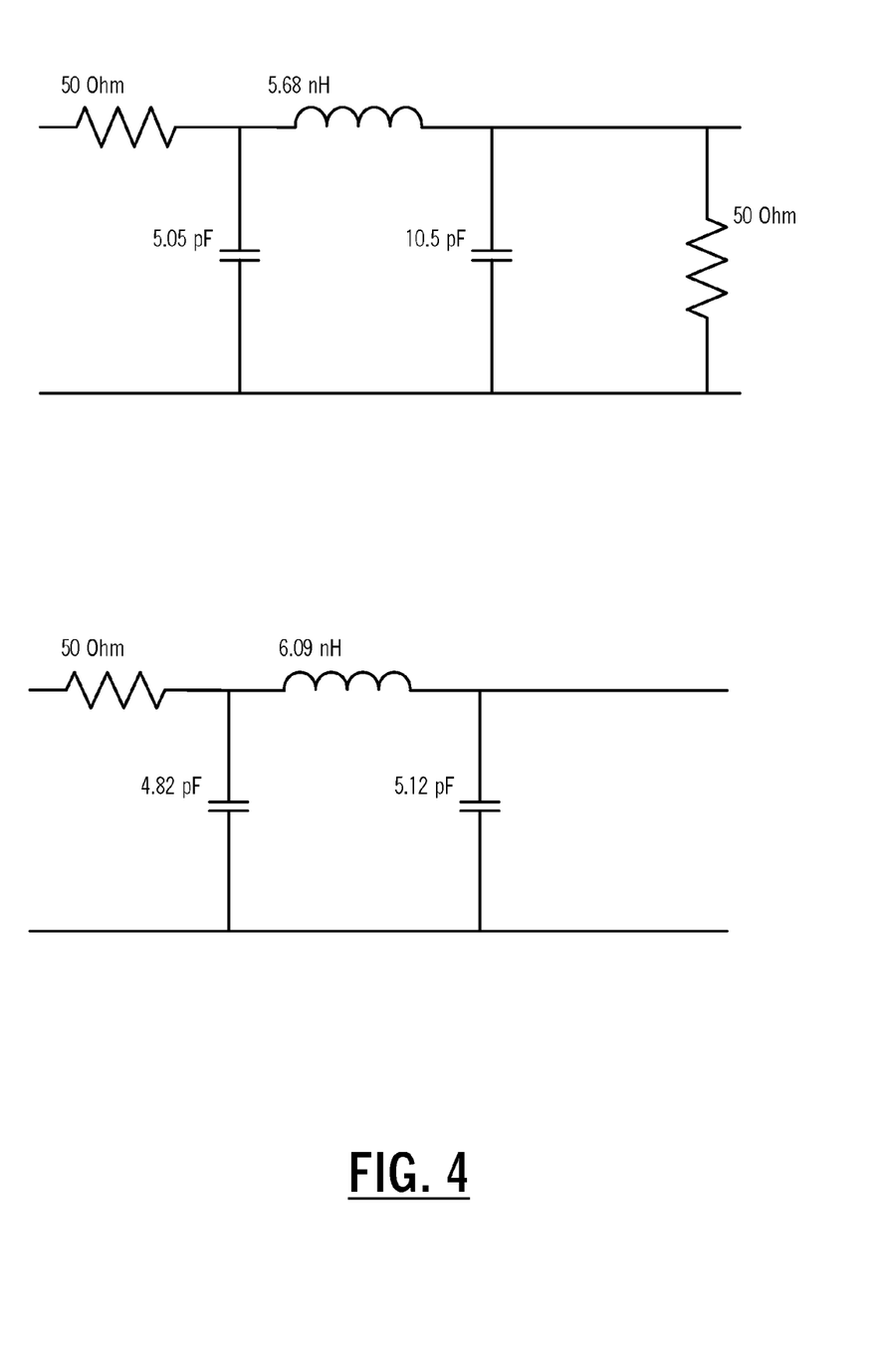
FIG. 4 is a series of schematic diagrams illustrating terminated (top) and unterminated (bottom) $3^{rd}$-order LC ladder receiver filters corresponding to a 9-tap analog FIR transmitter filter.
Figure 5:
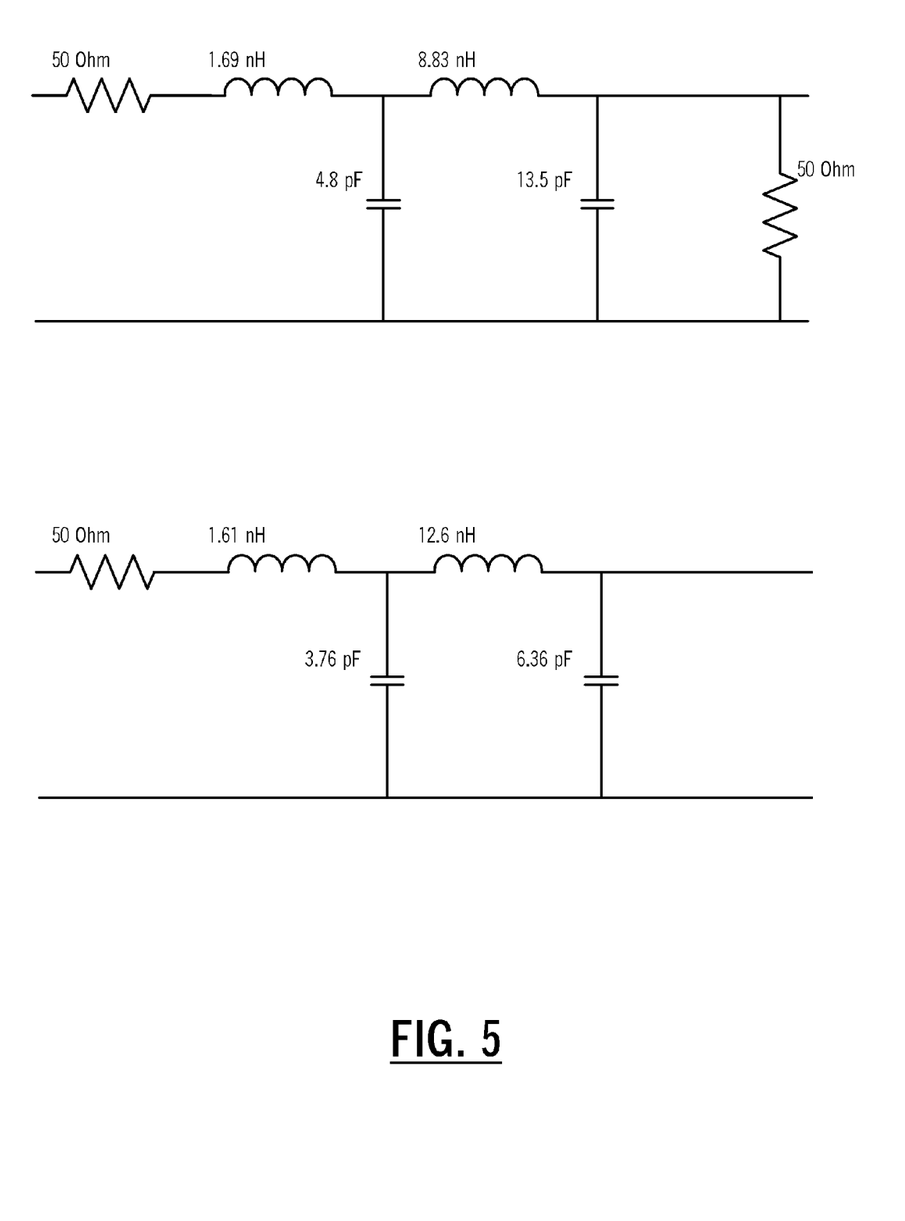
FIG. 5 is a series of schematic diagrams illustrating terminated (top) and unterminated (bottom) $4^{th}$-order LC ladder receiver filters corresponding to a 7-tap analog FIR transmitter filter.

More specifically, FIG. 3 is a series of schematic diagrams illustrating terminated (top) and unterminated (bottom) $2^{nd}$-order LC ladder receiver filters 14 (FIG. 1) corresponding to a 13-tap analog FIR transmitter filter 12 (FIG. 1) and 16 (FIG. 2), with the following taps: −0.0375, 0.077, −0.2098, 0.0425, 1, −0.1397, 0.1465, −0.344, 0.4262, −0.1737, 0.0855, −0.1185, and 0.0601. FIG. 4 is a series of schematic diagrams illustrating terminated (top) and unterminated (bottom) $3^{rd}$-order LC ladder receiver filters 14 (FIG. 1) corresponding to a 9-tap analog FIR transmitter filter 12 (FIG. 1) and 16 (FIG. 2), with the following taps: 0.0043, 0.0408, −0.1857, 0.0109, 1, −0.0782, 0.0789, −0.1198, and −0.0196. FIG. 5 is a series of schematic diagrams illustrating terminated (top) and unterminated (bottom) $4^{th}$-order LC ladder receiver filters 14 (FIG. 1) corresponding to a 7-tap analog FIR transmitter filter 12 (FIG. 1) and 16 (FIG. 2), with the following taps: −0.1207, −0.0490, 1, −0.0258, 0.0488, −0.1220, and 0.0331.

The approach described above may be readily extended to higher order modulation formats. For example, a QPSK format is simply a parallel arrangement of two identically filtered binary data streams, I and Q, with a subsequent 90-degree shift between their corresponding I and Q carriers. One bit of information is carried on each of I and Q.

Figure 6:
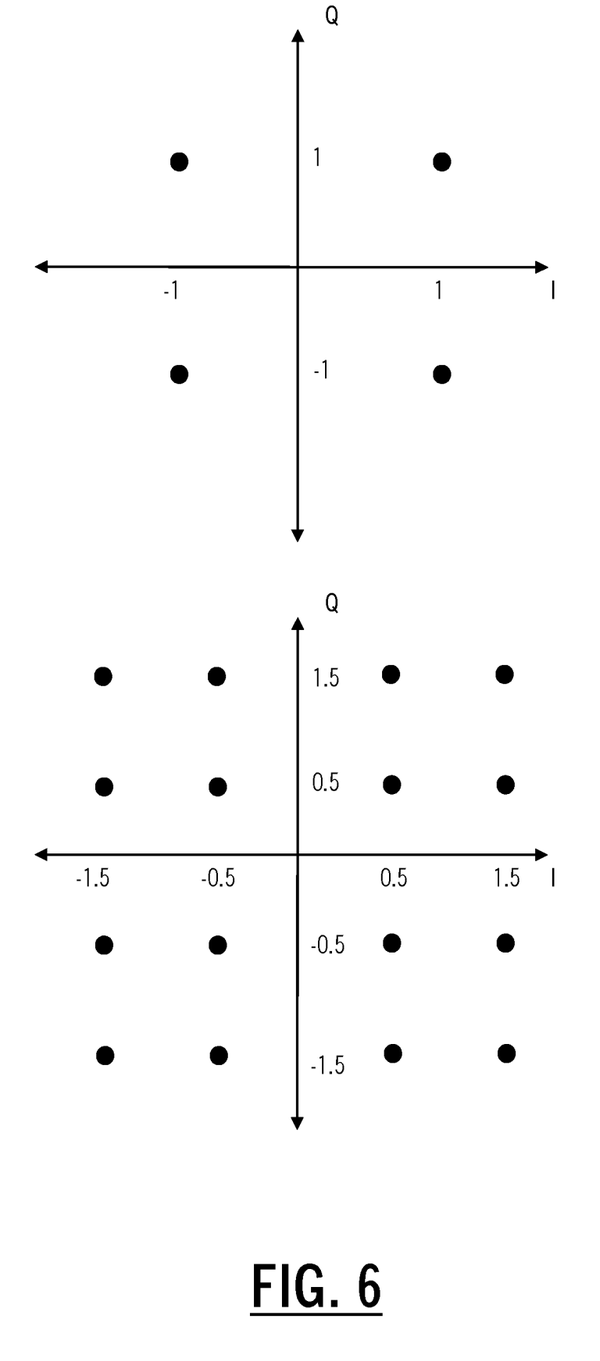
FIG. 6 is a series of plots illustrating I/Q constellations for QPSK (top) and 16-QAM (bottom) formats.

Higher order QAM formats may be constructed from a linear superposition of individual information bits in I and Q. FIG. 6 is a series of plots illustrating I/Q constellations for QPSK (top) and 16-QAM (bottom) formats. As is illustrated, QPSK constellation is achieved by modulating I and Q as binary data streams (i.e. I=+/−1). 16-QAM constellation is achieved by modulating I and Q as an addition of two binary data streams (i.e. I=I1+I2=+/−1+/−0.5).

Figure 7:
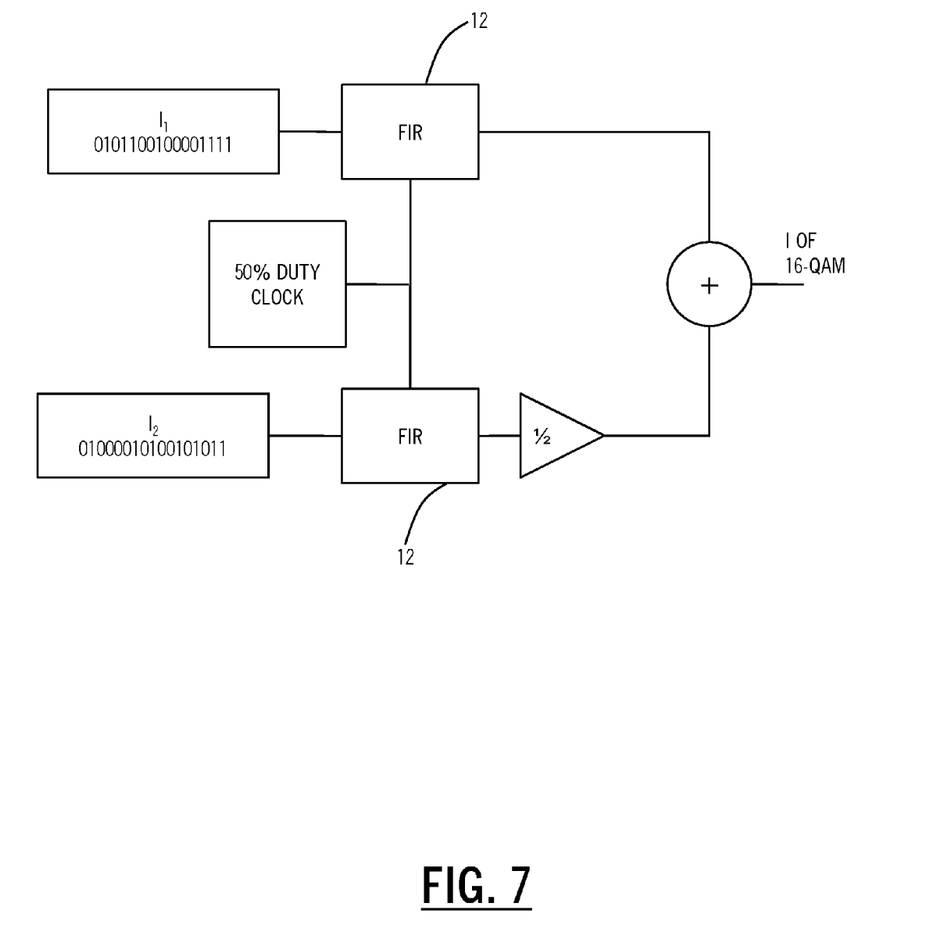
FIG. 7 is a schematic diagram illustrating one exemplary embodiment of simultaneous pulse shaping and digital-to-analog conversion for an I channel.

FIG. 7 is a schematic diagram illustrating one exemplary embodiment of simultaneous pulse shaping and digital-to-analog conversion for the I channel. A parallel combination of FIR filters 12, with properly linearly scaled outputs may be used to simultaneously provide the pulse shaping and digital-to-analog conversion functions required for the generation of multi level modulation formats.

The pulse shaping FIR transmitter filter 12 (FIG. 1) and 16 (FIG. 2) is not only capable of equalizing the physical imperfections of transmitter or receiver components, but may also pre-correct the phase distortion of the signal propagating through the dispersive channel. In case of a fiber optic communication channel, it is chromatic dispersion (CD) of the optical fiber that causes detrimental GVD.

Figure 8:
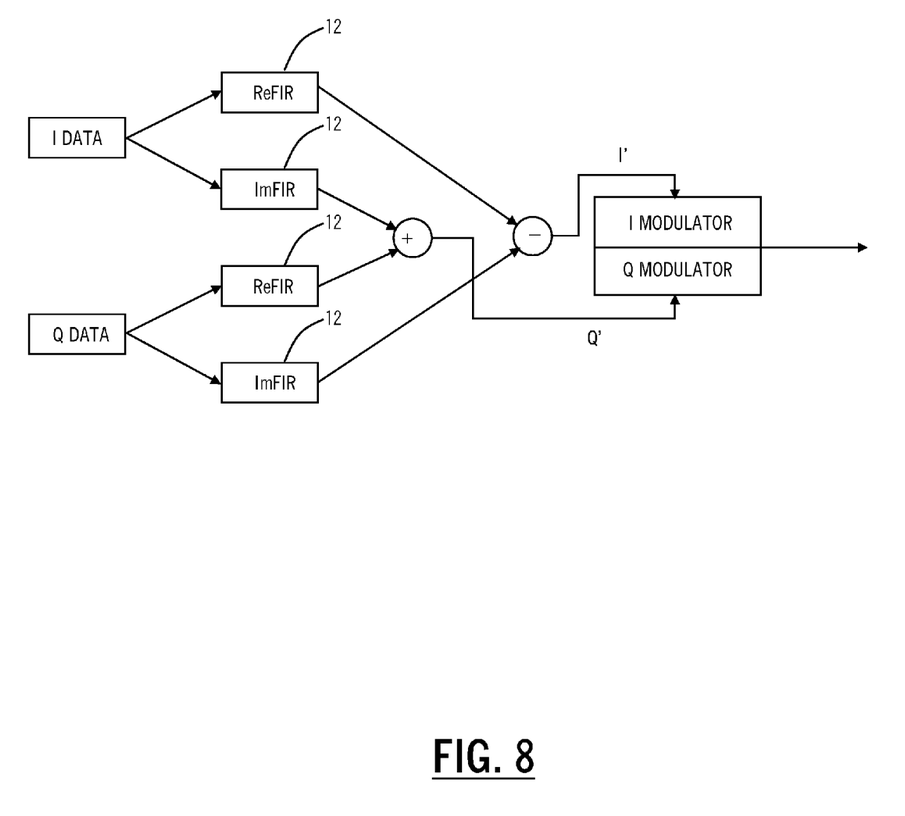
FIG. 8 is a schematic diagram illustrating one exemplary embodiment of implementation of group velocity dispersion (GVD) precompensation using FIR filters for OQAM.
Figure 9:
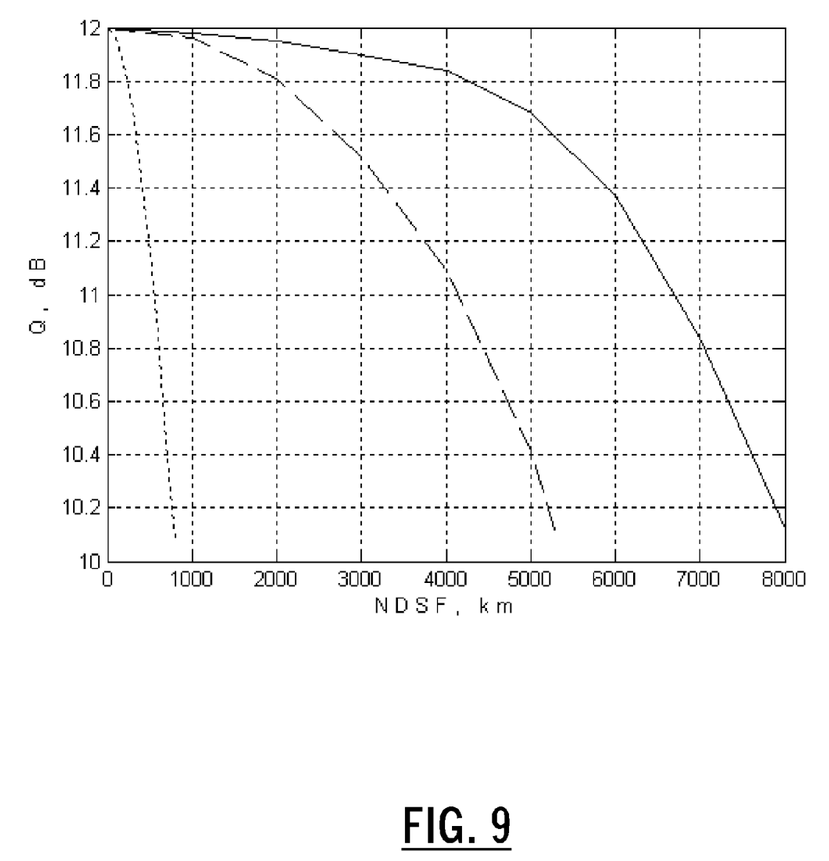
FIG. 9 is a plot illustrating the GVD related Q in dB with a 13-tap FIR filter (solid), 9-tap FIR filter (dashed), and without precompensation (dotted) versus the length of uncompensated non-dispersion shifted fiber (NDSF), assuming a 4 Gbaud QPSK signal and a baseline signal-to-noise ratio, Q, of 12 dB.

FIG. 8 is a schematic diagram illustrating one exemplary embodiment of implementation of GVD pre-compensation using FIR filters 12 for OQAM. It should be noted that I data and FIR filters 12 may be parallelized, as described above, to achieve multi level, multi bit modulation. The number of FIR filters 12 is doubled to carry out the emulation of both the real (ReFIR) and imaginary (ImFIR) parts of the complex phase factor produced by the CD originated phase:

$$\Phi = \frac{LD\pi f^2 \lambda^2}{C}. \quad (1)$$

Both I and Q data are filtered by two analog FIR filters 12; the ReFIR filter and the ImFIR filter. The ReFIR filter combines Nyquist pulse shaping with frequency domain multiplication by cos $\Phi$, while the ImFIR filter combines Nyquist pulse shaping with frequency domain multiplication by sin $\Phi$. The outputs of the filters 12 are combined algebraically to produce the GVD pre-compensated I' and Q' waveforms, which are applied to their respective I and Q modulators:

$$I'(f)=I(f)\cos \Phi - Q(f)\sin \Phi \quad (2)$$

$$Q'(f)=I(f)\sin \Phi + Q(f)\cos \Phi, \quad (3)$$

where I(f) and Q(f) are the spectra of the Nyquist shaped I and Q waveforms for D=0. The taps of the ReFIR and ImFIR filters 12 are calculated as half baud time samples of pulse responses corresponding to the I'(f) and Q'(f) spectra, respectively. It is apparent that for D=0, all taps of the ImFIR filter 12 are equal to 0, leaving only the ReFIR filter 12 effective.

For example, the taps of the 13-tap analog ReFIR filter 12 for 1,000 km of NDSF worth of CD are: −0.0049, 0.0046, 0.0031, 0.0425, −0.227, 0.1466, 0.7915, 0.1103, −0.0438, −0.0461, −0.0619, 0.0222, and −0.0129. The taps of the analog ImFIR filter 12 are: −0.0003, −0.0001, 0.011, −0.0538, 0.0591, 0.1922, −0.4393, 0.2933, −0.1112, 0.0743, −0.0258, 0.001, and −0.0012. This perfectly precompensates for the for GVD impairments.

Thus, the analog continuous time matched pulse shaping transmitter and receiver filters of the present invention find particular applicability in ultra high capacity transceivers, such as those carrying 100 Gbps, 400 Gbps, and 1,000 GBps of data. The concepts of the present invention may be applied to the optical side, the backplane links, and/or the interchip links. Because the receiver filter is implemented in passive LC stages, ultra low power consumption may be achieved. These LC stage components are readily implemented in conventional CMOS or BiCMOS circuitry. Because the transmitter uses a quasi digital FIR filter, simple and precise digital control of signal delays is possible, as well as the low power analog combination of weighted signal taps. The combination of FIR transmitters and LC receiver filters provides an optimizable combination for the suppression of ISI, ICI, and noise. The FIR transmitter filter provides a natural extension for dealing with multi level formats, such as MQAM. The FIR transmitter filter also provides intrinsic capability for dealing with circuit manufacturing errors and/or lifetime drift. The FIR transmitter filter further provides intrinsic capability for dealing with channel impairments, such as dispersion and loss.

Although the present invention has been illustrated and described herein with reference to preferred embodiments and specific examples thereof, it will be readily apparent to those of ordinary skill in the art that other embodiments and examples may perform similar functions and/or achieve like results. Likewise, it will be apparent that other applications of the disclosed technology are possible. All such equivalent embodiments and examples are within the spirit and scope of the present invention, are contemplated thereby, and are intended to be covered by the following claims.

What is claimed is:

1. A circuit, comprising:
a transmitter filter comprising a quasi digital filter that utilizes digital data as inputs provided to a shift register buffer stage and clocked through the shift register buffer stage in a discrete-time manner and outputs of the shift register buffer stage that are continuous-time analog signals which are weighted and summed in an analog domain;
a receiver filter comprising an analog filter; and
a communicative coupling between the transmitter filter and the receiver filter;
wherein the transmitter filter and the receiver filter are matched for noise reduction, wherein the transmitter filter compensates for non-ideal filtering properties of the receiver filter by adjusting its taps, and wherein the combined responses of the transmitter filter and the receiver filter satisfy the Nyquist criteria;
wherein the transmitter filter comprises a pulse shaping quasi digital finite impulse response filter, wherein the transmitter filter is dynamically adaptable to compensate for optical channel distortion impairments; and
wherein the receiver filter comprises an inductor-capacitor ladder based filter, wherein only a single separate receiver filter is used per I and Q data streams prior to demodulation and decision slicing of a multi-level, multi-bit modulation formatted signal.

2. The circuit of claim 1, wherein the pulse shaping quasi digital finite impulse response filter utilizes a combination of digital delays and analog coefficient control and tap summation.

3. The circuit of claim 1, wherein the pulse shaping quasi digital finite impulse response filter is calibrated to compensate for residual manufacturing imperfections of both transmitter and receiver components.

4. The circuit of claim 1, wherein the pulse shaping quasi digital finite impulse response filter and transmitter data processing are utilized to provide simultaneous pulse shaping and digital-to-analog conversion required for multi level, multi bit modulation formats.

5. The circuit of claim 1, wherein the inductor-capacitor ladder based filter is implemented in one of CMOS and BiCMOS circuitry.

6. The circuit of claim 1, wherein the transmitter filter and the receiver filter are selected and matched such that they provide optimized suppression of one or more of inter signal interference and inter channel interference.

7. A transmission system, comprising:
a transmitter comprising a transmitter filter comprising a quasi digital filter that utilizes digital data as inputs provided to a shift register buffer stage and clocked through the shift register buffer stage in a discrete-time manner and outputs of the shift register buffer stage that are continuous-time analog signals which are weighted and summed in an analog domain;

a receiver comprising a receiver filter comprising an analog filter; and a communicative coupling between the transmitter and the receiver;

wherein the transmitter filter and the receiver filter are matched for noise reduction, wherein the transmitter filter compensates for non-ideal filtering properties of the receiver filter by adjusting its taps, and wherein the combined responses of the transmitter filter and the receiver filter satisfy the Nyquist criteria;

wherein the transmitter filter comprises a pulse shaping quasi digital finite impulse response filter, wherein the transmitter filter is dynamically adaptable to compensate for optical channel distortion impairments; and wherein the receiver filter comprises an inductor-capacitor ladder based filter, wherein only a single separate receiver filter is used per I and Q data streams prior to demodulation and decision slicing of a multi-level, multi-bit modulation formatted signal.

8. The transmission system of claim 7, wherein the pulse shaping quasi digital finite impulse response filter utilizes a combination of digital delays and analog coefficient control and tap summation.

9. The transmission system of claim 7, wherein the pulse shaping quasi digital finite impulse response filter is calibrated to compensate for residual manufacturing imperfections of both the transmitter and the receiver.

10. The transmission system of claim 7, wherein the pulse shaping quasi digital finite impulse response filter and transmitter data processing are utilized to provide simultaneous pulse shaping and digital-to-analog conversion required for multi level, multi bit modulation formats.

11. The transmission system of claim 7, wherein the inductor-capacitor ladder based filter is implemented in one of CMOS and BiCMOS circuitry.

12. The transmission system of claim 7, wherein the transmitter filter and the receiver filter are selected and matched such that they provide optimized suppression of one or more of inter symbol interference and inter channel interference.

13. A transmission method, comprising:

at a transmitter, filtering a signal utilizing a transmitter filter comprising a quasi digital filter that utilizes digital data as inputs provided to a shift register buffer stage and clocked through the shift register buffer stage in a discrete-time manner and outputs of the shift register buffer stage that are continuous-time analog signals which are weighted and summed in an analog domain;

transmitting the signal from the transmitter to the receiver utilizing a communicative coupling; and at a receiver, filtering the signal utilizing a receiver filter comprising an analog filter;

wherein the transmitter filter and the receiver filter are matched for noise reduction, wherein the transmitter filter compensates for non-ideal filtering properties of the receiver filter by adjusting its taps, and wherein the combined responses of the transmitter filter and the receiver filter satisfy the Nyquist criteria;

wherein the transmitter filter comprises a pulse shaping quasi digital finite impulse response filter, wherein the transmitter filter is dynamically adaptable to compensate for optical channel distortion impairments; and wherein the receiver filter comprises an inductor-capacitor ladder based filter, wherein only a single separate receiver filter is used per I and Q data streams prior to demodulation and decision slicing of a multi-level, multi-bit modulation formatted signal.

14. The transmission method of claim 13, wherein the transmitter filter and the receiver filter are selected and matched such that they provide optimized suppression of one or more of inter signal interference and inter channel interference.

* * * * *